United States Patent [19]

Doundoulakis

[11] 4,307,711
[45] Dec. 29, 1981

[54] SUN TRACKING SOLAR ENERGY COLLECTOR SYSTEM

[76] Inventor: George J. Doundoulakis, 2498 Kayron La., North Bellmore L.I., N.Y. 11710

[21] Appl. No.: 124,517

[22] Filed: Feb. 25, 1980

[51] Int. Cl.³ .............................................. F24J 3/02
[52] U.S. Cl. .................................... 126/442; 126/440
[58] Field of Search ............... 126/424, 425, 440, 442, 126/443, 441, 446, 450, 417

[56] References Cited

U.S. PATENT DOCUMENTS

| | | | |
|---|---|---|---|
| 1,599,481 | 9/1926 | Marcuse | 126/440 |
| 1,683,266 | 9/1928 | Shipman | 126/440 |
| 3,203,167 | 8/1965 | Green | 126/440 |
| 3,869,199 | 3/1975 | Cummings | 126/440 |
| 4,022,186 | 5/1977 | Northrup | 126/440 |
| 4,069,812 | 1/1978 | O'Neill | 126/440 |
| 4,119,085 | 10/1978 | Knowles et al. | 126/443 |
| 4,187,123 | 2/1980 | Diggs | 126/440 |
| 4,188,941 | 2/1980 | Hopkins | 126/440 |
| 4,205,661 | 6/1980 | Chapman | 126/440 |
| 4,238,246 | 12/1980 | Genequand | 126/440 |

*Primary Examiner*—Daniel J. O'Connor
*Attorney, Agent, or Firm*—Constantine A. Michalos; Peter C. Michalos

[57] ABSTRACT

A sun tracking solar energy collector system comprising a plurality of light focusing elements disposed side by side in the form of a surface array, providing a linear array of foci; and a metallic heat exchanger tube having externally a high absorbtivity, low reflectivity coating containing a working fluid such as water, air, hydrogen or helium, to which a substantial portion of the energy in the focused light is imparted. The system includes an insulator tube external to the heat exchanger and providing small apertures covered by glass to allow the light focused by each focusing element to enter the interior of the insulator tube, where the light may impinge directly on the heat exchanger tube or on solar cells attached to the heat exchanger and facing the apertures, for conversion of a portion of the focused light energy directly into electricity, while the greater portion of the energy focused through the apertures ends up as heat through the heat exchanger tube into the working fluid, capable of raising its temperature to a desirable temperature. A highly reflective internal surface of the insulator tube serves to reflect toward the heat exchanger radiation reaching it from the solar cells and the heat exchanger, so that with the reflective internal surface being much larger than the surface covered by the apertures a very small percentage of the radiated energy is allowed to escape to space through the apertures. A vacuum maintained between the heat exchanger and the external insulator tube serves to minimize conductive losses.

7 Claims, 14 Drawing Figures

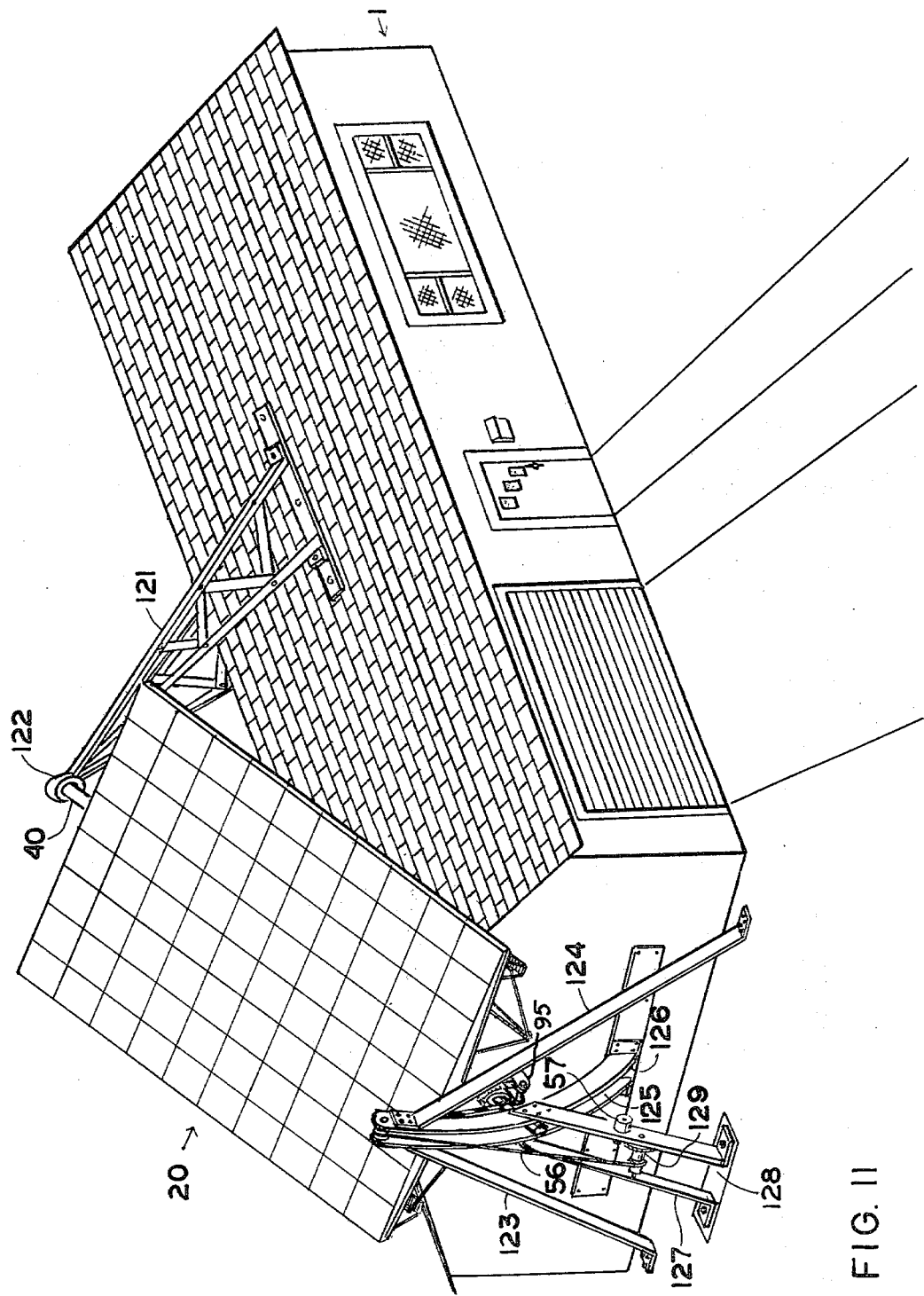

SUN TRACKING SOLAR ENERGY COLLECTOR SYSTEM

BACKGROUND OF THE INVENTION

1. Field of the Invention

This invention relates in general to solar energy collectors for capturing solar energy falling over a surface area, in terms of heat, raising the temperature of a fluid, and particularly to a sun tracking solar energy collector system means for increasing the temperature of the fluid and the efficiency of solar energy capture per unit of area using focussing means, solar tracking means, solar cells and an internal type heat exchanger means.

2. Description of the Prior Art and of Optimizing Factors

There has been a number of devices for capturing and utilizing heat energy from the sunlight. One type of such devices is the passive non tracking solar energy collecting panels providing in effect heat exchanging means between a highly light absorbing coating and water which is used for heating during the winter and for faucet hot water the year around. Coatings with much higher absorbitivity than emissivity in the range of the solar spectrum have been developed. The principle of what is commonly known as the "hot house effect" whereby visible light is easily transmitted through a transparent sheet, such as glass or acrylic plastic, imparting heat energy onto the absorbing surface at relatively low temperatures, so that the surface then can only radiate in the infrared spectrum which is only partially transmitted through said sheet, is beneficially used to retain the captured heat. The main drawbacks of this type of solar collecting devices are:

1. Lacking sun tracking the surface where the light collecting device is installed is inefficiently used due to the cosine law, capturing only a small portion of its potential energy capture.

2. The temperature at which the water can be raised is relatively low (about 145° F.). While low temperature is useful for heating and for hot water, it cannot be used efficiently for the generation of electricity or to provide for air-conditioning through an absorption type refrigeration unit.

3. Despite the "hot house effect" a considerable amount of the captured heat is being re-radiated into space, or lost through conduction to the outside air.

4. Defining a price quality factor as the yearly dollar benefit derived by the device, divided by the overall cost of the installation, it has been found that such factor is relatively low for this type of solar collectors.

A second type of solar collecting devices may be referred to as line focus solar energy collecting devices which use optical means such as Fresnel lenses or cylindrical paraboloidal reflectors to concentrate the sun light along a narrow focal line. This type may or may not include sun tracking means.

The main benefit of the line focus solar collectors is that they provide sufficient light concentration to heat working fluid such as water to an intermediate temperature such as between 200 and 300° F. Such water temperatures are capable of efficiently providing heat to an absorption type air conditioning system besides providing heating during the winter and hot water.

The main drawback of the line focus solar collectors is the relatively high percentage or radiation losses, as a relatively high percentage of the heat exchanger receiving the radiation is exposed to radiate back into space. Difficulties also exist in keeping a vacuum between an inner heat exchanger and an outer shield when a slot along the outer shield must remain transparent for the solar radiation to enter. Attempting to cover the slot with a transparent substance such as glass while keeping the glass sealed surrounding a metallic inner heat exchanger, and at a wide range of temperatures, while maintaining a vacuum between the glass shield and the metallic heat exchanger.

A third type of solar collecting devices may be referred to as superimposed focusing collectors providing focusing of a multiplicity of sun tracking reflectors commonly referred to as heliostats, on to same area of a heat exchanger, where substantially high temperature can be sustained.

The main advantage of the superimproved focussing solar collectors in that they can gather substantial amounts of solar energy per day, measured in megawatt hrs. per day. A drawback is that only a small portion of the heliostats is contributing efficiently to the common heat exchanger at any time. Also because of the high temperatures involved at the heat exchanger radiation losses can be considerable. This type of system can be acceptable in areas with high intensity of sun-light and inexpensive land.

While the solar energy now falling over the roofs of houses and industrial buildings is almost entirely being wasted, as the price of oil will increase, the value of this energy will also increase. Solar energy collectors which may appear to provide a benefit in terms of hot water to a homeowner today may be determined to be wasteful a few years from now when the cost of thermal energy will have substantially been increased.

It should be noted that it is not only the number of BTU's collected per year per unit area of surface that counts but also the temperature at which these BTU's are counted. The higher the temperature of the working fluid the higher the value of the energy because the heat in the hotter working fluid can be converted into more valuable forms of energy such as electricity, at a higher efficiency. From Carnot's cycle considerations the maximum thermal efficiency possible in a heat engine is $$nc = 1 - T_L/T_H \tag{1}$$

Where $T_H$ and $T_L$ are the high and low temperatures between which the engine operates, expressed as absolute temperatures. If $T_L$ is taken to be the ambient temperature, which is usually the case, the efficiency $n_c$ deteriorates as $T_H$ is approaching $T_L$. While $n_c$ is unattainable in practical engines, the expression $(1 - T_L/T_H)$ turns out to be a controlling factor in the expression of the efficiency of heat engines. It is for this reason that BTU's at relatively low temperature gases such as the gases from the flute of oil burners and the exhaust of the automobiles are allowed to excape because the temperature of such gases is too low compared to the high temperature of the system.

Another desirable feature of a solar energy collection system is the evenness of energy output during a normal sunny day. The smaller the variation of energy output during the day the less energy storage will be required by the system.

On these basis it will be useful that a qualification factor "q" of a solar energy collection system be defined in such a way as to include all relevant factors, such as shown in the following equation:

$$q = (1 - T_A/T_H) \times K /(A \times C \times \sigma) \qquad (2)$$

Where
- $T_A$ is the average absolute ambient Temperature;
- $T_H$ is the high temperature of the working fluid;
- K is the ratio of the amount of energy retained by the collector divided by the amount of energy incident per unit area at normal incidence;
- A is the area of ground or roof utilized by the solar collecting device;
- C is total cost in dollars for implementing the system; and
- $\sigma$ is the standard deviation of BTU output per hour per unit area of collector during the 12 sunny hourly intervals, 6 a.m. to 6 p.m. daily.

QUALITY FACTORS OPTIMIZED BY INVENTION

The present invention aims at optimizing a qualification factor such as q, by optimizing each of its factors as follows:

K is being optimized by the invention's providing means for sun tracking for both daily motion of the sun and the seasonal declination of latitude ±23.5°. K is further being optimized by the invention's providing means for minimizing radiation losses. $(1 - T_A/T_H)$ is being improved by the invention increasing the temperature of the working fluid through focussing of the solar energy, preferably through lenses;

A is being minimized by the invention by positioning a multiplicity of focussing lenses on a single platform thereby tracking the sun in unison and precluding shading of one lense by another as it usually occurs in other systems during the early morning and late afternoon hours.

$\sigma$ is being minimized by the sun tracking and by avoiding shading through the single platform principle.

SUMMARY OF THE INVENTION

The present invention provides a sun tracking solar energy collection system preferably utilizing parallel strips of the central area of a focusing element such as Fresnal lenses, disposed side by side to form a surface array, providing a linear array of foci for focusing the intercepted energy on substantially circular spots on an internal tubular metallic heat exchanger, or on solar cells thermally connected and supported with the heat exchanger, the light beams of each focusing element being allowed to enter an outer insulating tube, covering the heat exchanger tube, through a small circular aperture covered by a transparent material such as glass, on the external insulating tube. The external tube provides insulation against re-radiation by having its internal surface highly reflective in order that it reflects energy radiated outwardly back towards the inner heat exchanger tube. In this manner, while the collected energy reaches the solar cells or the heat exchanger, the radiation emitted by the solar cells and the heat exchanger, that can escape back into space, is proportional to the ratio of the total area of the apertures, divided by the total insulator tube surface. This ratio depends on the spacing between apertures and the size of each aperture. As the ratio can be designed to be very small the invention provides for improved retention of the collected energy. The invention also provides insulation against conductive losses by providing a vacuum between inner and outer tubes. A single solar tracking platform supporting the focusing panels and the energy gathering components provides a most efficient light gathering utilisation of a building roof or other surface.

Accordingly an object of the present invention is to provide a sun tracking solar energy collector comprising:

optical focusing means for concentrating sunlight falling on rectangular surface strips of optical focusing elements onto a much smaller area in the vicinity of the focus of the optical focusing means:

a tubular metallic heat exchanger for containing a working fluid such as water or a gas and running along the foci of the optical focusing means thereby transferring the heat received by the concentrated sunlight to the working fluid;

an insulating tube preferably metallic placed around the heat exchanger and presenting a highly reflective internal surface towards the metalic heat exchanger for reflecting back radiation emitted by the heat exchanger;

small circular openings on the insulating tube covered with a transparent material such as glass for allowing the focused sunlight to enter the insulating tube and to reach the heat exchanger, the apertures constituting only a small portion of the total surface of the insulating tube;

a vacuum maintained between the heat exchanger and the insulating tube for lowering conductive heat losses between the heat exchanger and the outside air; and a solar tracking platform for supporting the solar focusing means, the heat exchanger, and the insulating tube so that the optical axis of the optical focusing means remains substantially allligned with the direction of the sun.

A further object of the present invention is to provide a solar energy collector of high surface utilization.

A still further object of the present invention is to provide a solar energy collector capable of raising the temperature of the working fluid to a useful temperature preferably above the boiling temperature of water.

A still further object of the present invention is to minimize shading of one focusing means by another focusing means.

Another object of the invention is to efficiently utilize the height immediately above the solar energy collector by including a multiplicity of said light focusing means on same sun tracking platform.

Still another object of the invention is to provide a solar collector exhibiting an efficient retention of the captured heat energy by providing insulating means to minimize both radiative and conductive losses.

A still further object of the present invention is to provide a solar energy collector with efficient heat transfer properties to the working fluid.

Another object of the present invention is to convert a portion of focused sunlight energy directly into electricity by use of solar cells, while converting a substantial portion of the remaining energy into heat for house heating, air conditioning and faucet hot water, by having solar cells receive focused sunlight while a heat exchanger, supporting the cells, acts as their heat sink, absorbing the non converted energy as heat.

Another object of the present invention is to convert a portion of focused sunlight energy directly into electricity by use of solar cells, supported by a heat exchanger which is used as a heat sink, the cells being protected from mechanical damage by a tubular insulator external to the solar cells and the heat exchanger, and also protected from moisture damage through a vacuum maintained inside the tubular insulator.

Another object of the present invention is to provide a solar collector with minimum variation of heat energy output during the 12 hours of daily sunshine.

Still another object of the present invention is to provide a relatively light weight solar collector at relatively low cost compared to the yearly monetary benefit.

The various features of novelty which characterize the invention are pointed out with partialarity in the claims annexed to and forming a part of this disclosure. For a better understanding of the invention, its operating advantages and specific objects attained by its uses, reference should behad to the accompanying drawings and descriptive matter in which there is illustrated a preferred embodiment of the invention.

BRIEF DESCRIPTION OF THE DRAWINGS

In the drawings:

FIG. 11 is a side perspective view showing a second method of establishing sun tracking of the solar energy collecting platform.

DESCRIPTION OF THE PREFERRED EMBODIMENTS

Figure 1:
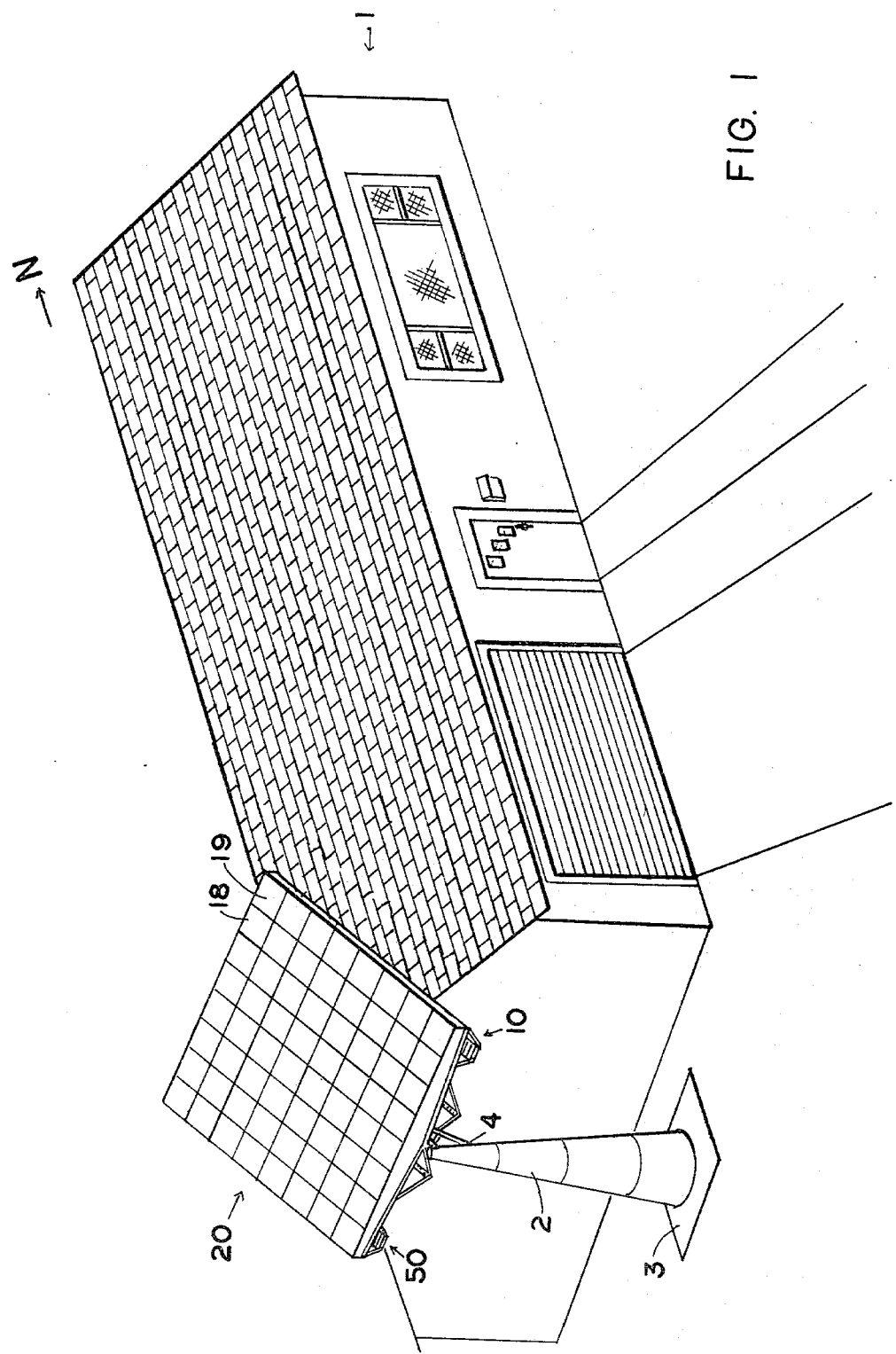
FIG. 1 is a side perspective view of a home installation of the invention, according to a preferred embodiment of the invention.
Figure 8:
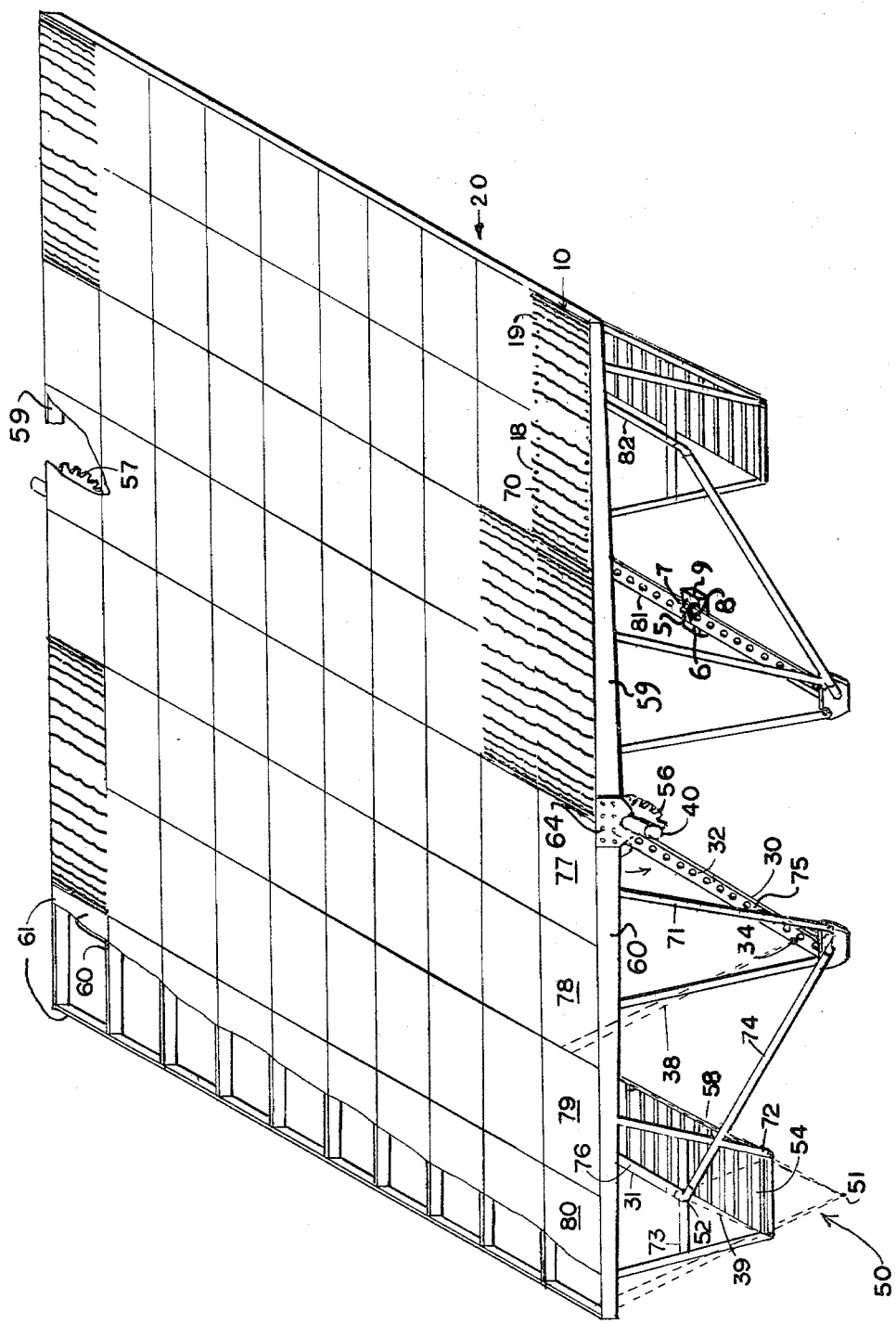
FIG. 8 is a side perspective view of a solar energy collecting platform with a plurality of lens panels installed and focusing on tubular heat exchanger means running along the foci of the lens panels through direct focusing and focusing through mirrors with sections shown broken off for clarity.

Referring now to the drawings and particular to FIG. 1 and 8 a sun tracking solar energy collector system comprises light focusing means 10 rigidly supported by a sun tracking platform 20. The platform 20 is rotatably supported at the ends of a shaft 40 so that it can be continuously tracking the sun during its daily motion from East to West.

Figure 5:
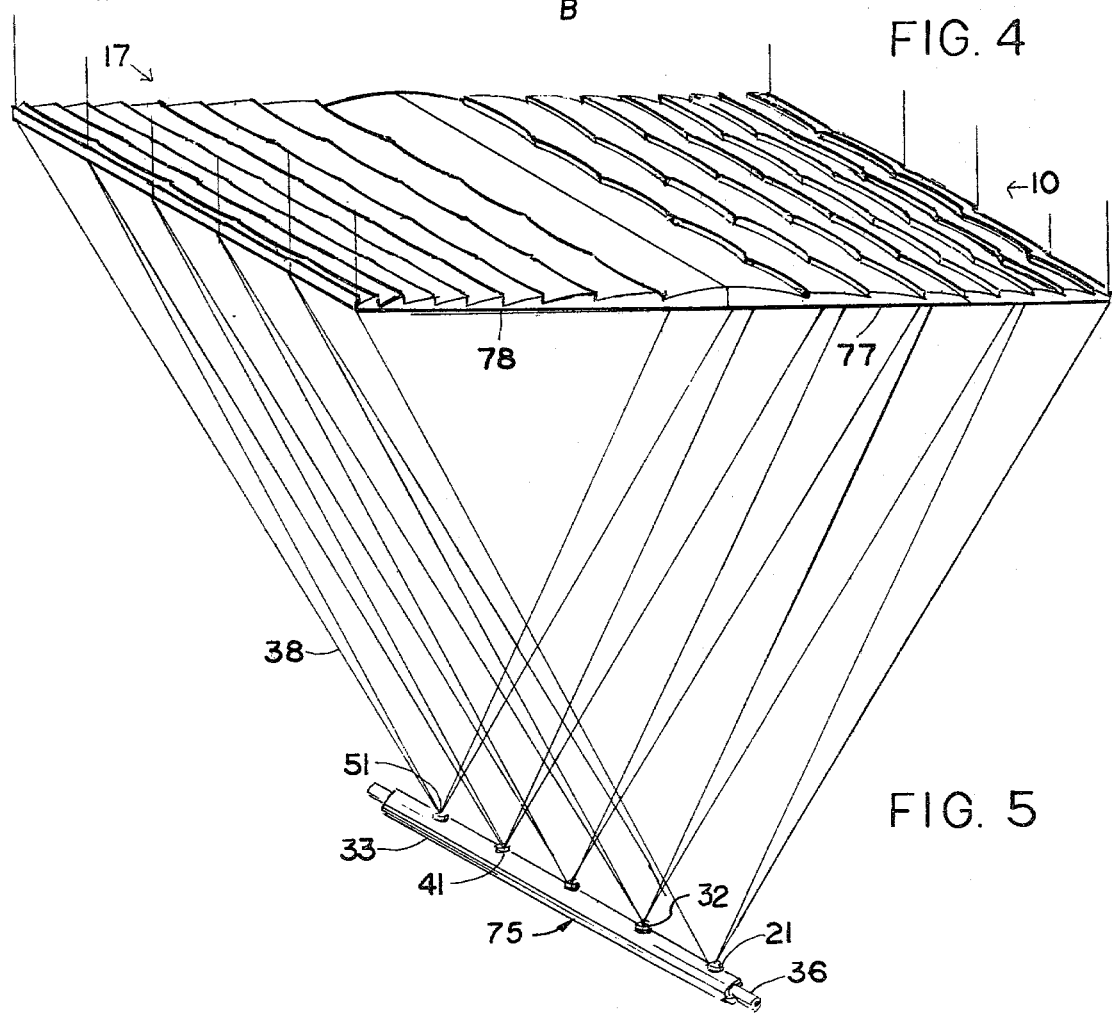
FIG. 5 is a side perspective view showing the lens panels of FIG. 4 focusing light at 5 focal points on a heat exchanger, running along the focal points.
Figure 6:
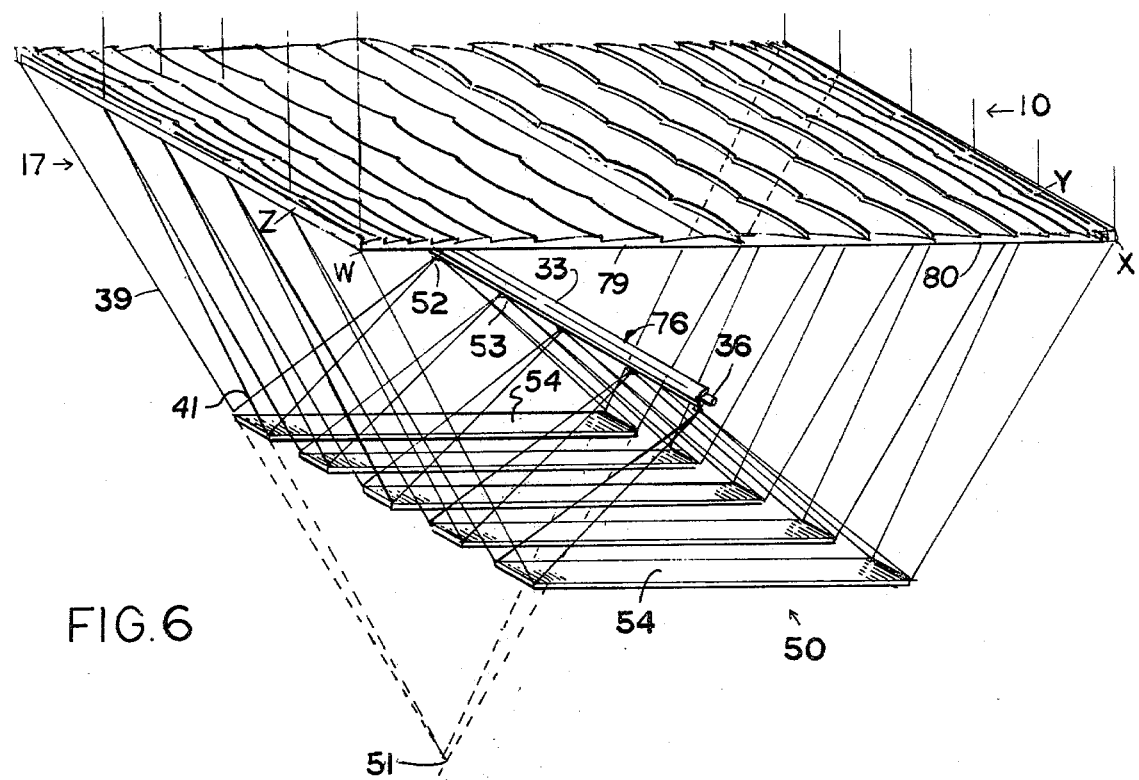
FIG. 6 is a side perspective view of same lens panels as in FIG. 5 but with mirrors added to reflect the light image back near the panels.
Figure 7A:
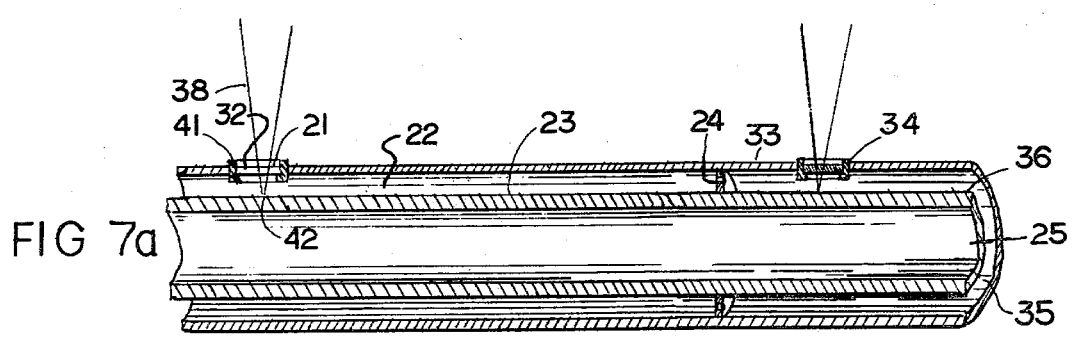
FIGS. 7a, 7b are side elevation cross sectional views of the heat exchanger, its insulating cover and a glass window allowing the focused light to reach the heat exchanger in FIG. 7a and a solar cell in FIG. 7b.
Figure 7B:
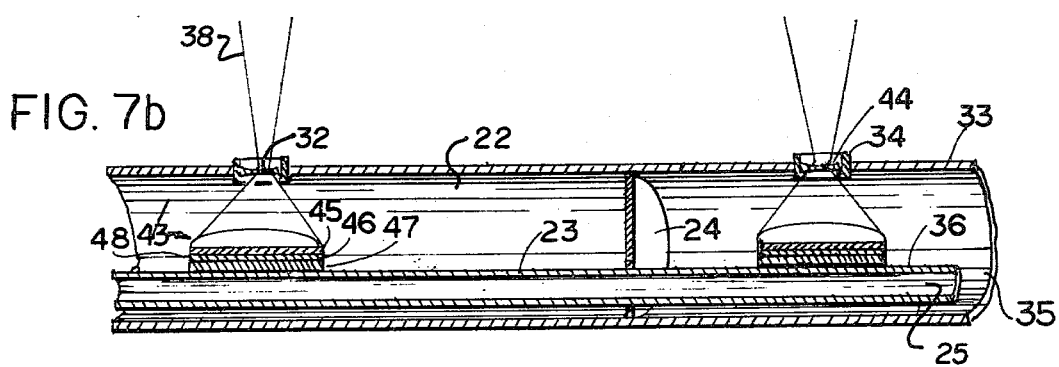

The sunlight is being concentrated by the focusing means 10, onto circular apertures 32 on a tubular insulator 33, allowing the light to reach an internal heat exchanger tube 36, shown in detail in FIGS. 7a & 7b. The solar light may reach an aperture such as aperture 34 directly as shown in FIG. 5 and FIGS. 7a and 7b by sun ray 38, or through a reflection on mirrors, such as mirrors 50, as shown in FIG. 6. In FIG. 6. In FIG. 6 the focus is effectively being displaced from a point 51 to a new point 52 symmetric to the point 51 with respect to the reflecting mirror 54.

As in the type of FIG. 5a heat exchanger 31 is supported internally of tube insulator 33 in the type where mirrors 50 are used. The heat exchanger 31 receiving the rays reflected by the mirrors 50, lies much closer to the focusing means 10. The circular aperture, such as apertures 32 allowing the concentrated light to reach the internal heat exchanger 36, are facing downwards, towards the mirrors 50, and therefore are not shown in FIG. 8.

Therefore, FIG. 8 shows two types of focusing. Direct focusing onto energy receiving means 75 as shown in FIG. 5 or indirect focusing through mirrors 50 onto energy receiving means 76, as shown in FIG. 6.

Figure 2A:
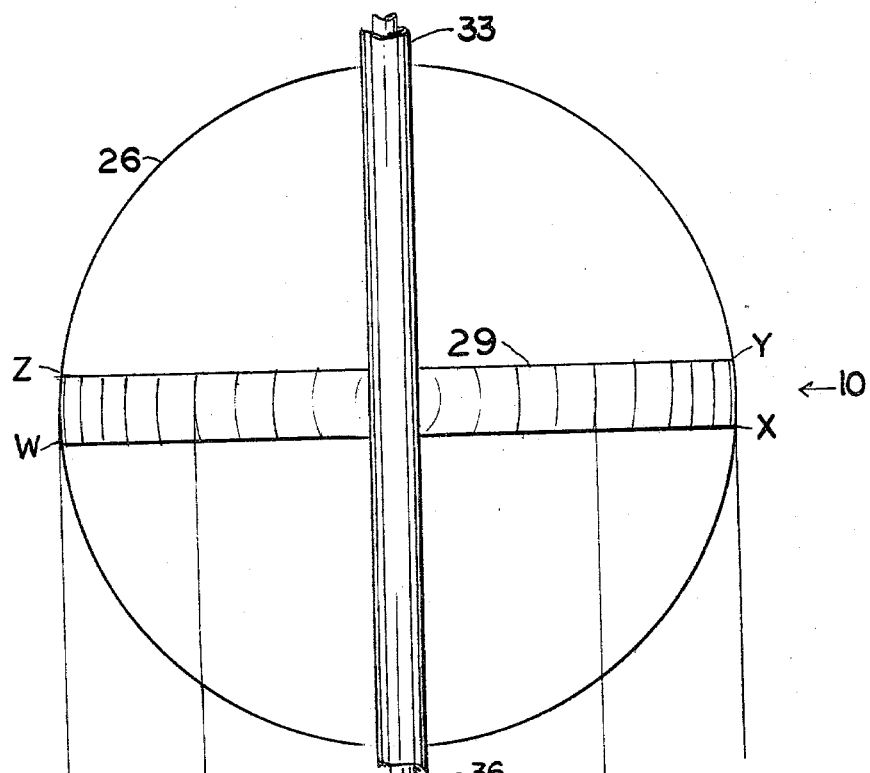
FIGS. 2a, 2b are plan view and side view, respectively, of a reflective type focusing element means showing the derivation of the portions of reflector WXYZ actually used in conjunction with heat exchanger means.
Figure 2B:
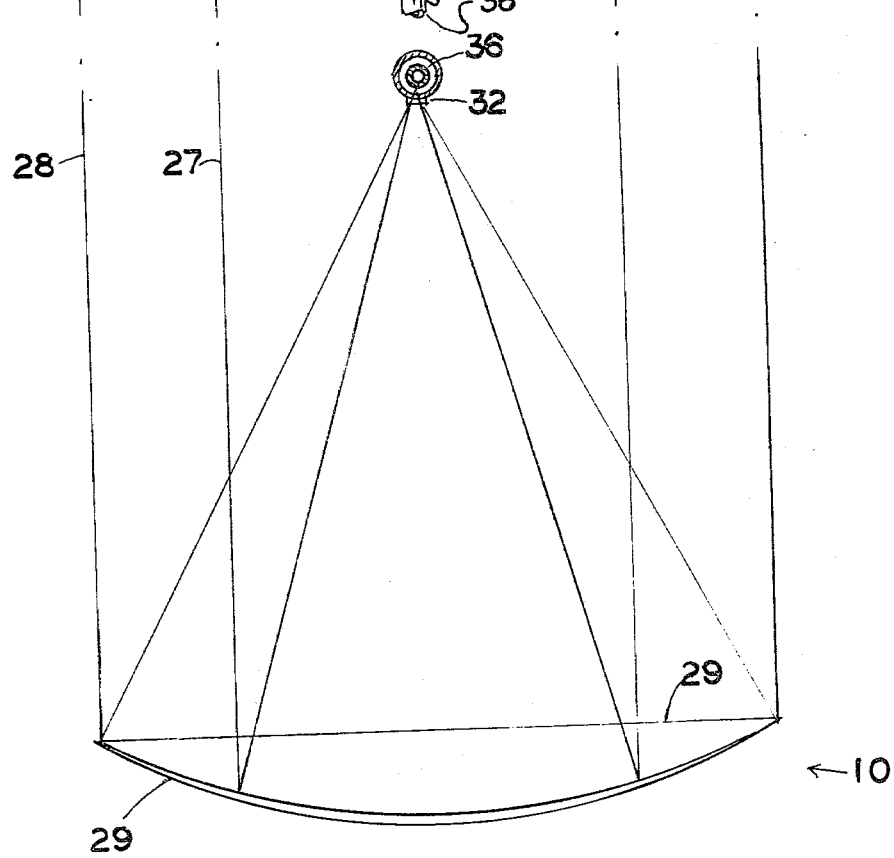

Referring now to FIGS. 2a and 2b a reflector 26 with focusing properties such as that of a paraboloid or a spherical surface, is used as the basis for the derivation of an element 29 which amounts to a relatively narrow strip along the center portion of the reflector. FIG. 2b shows light rays 27 and 28 being focused towards aperture 32.

While the reflective focusing means of FIGS. 2a and 2b could concentrate the solar light onto a linear array of focal points 51, as shown in FIG. 8, such reflectors would be harder to manufacture, to support and to keep properly alligned on the sun tracking platform 20. Full plano-convex or double convex refractive lenses, while desirable, would be extremely expensive and heavy for this application. The preferred type and particularly the basic element of the focusing means is a portion of a Fresnel lens the derivation of which is shown in FIGS. 3a and 3b.

Figures 3A, 3B:
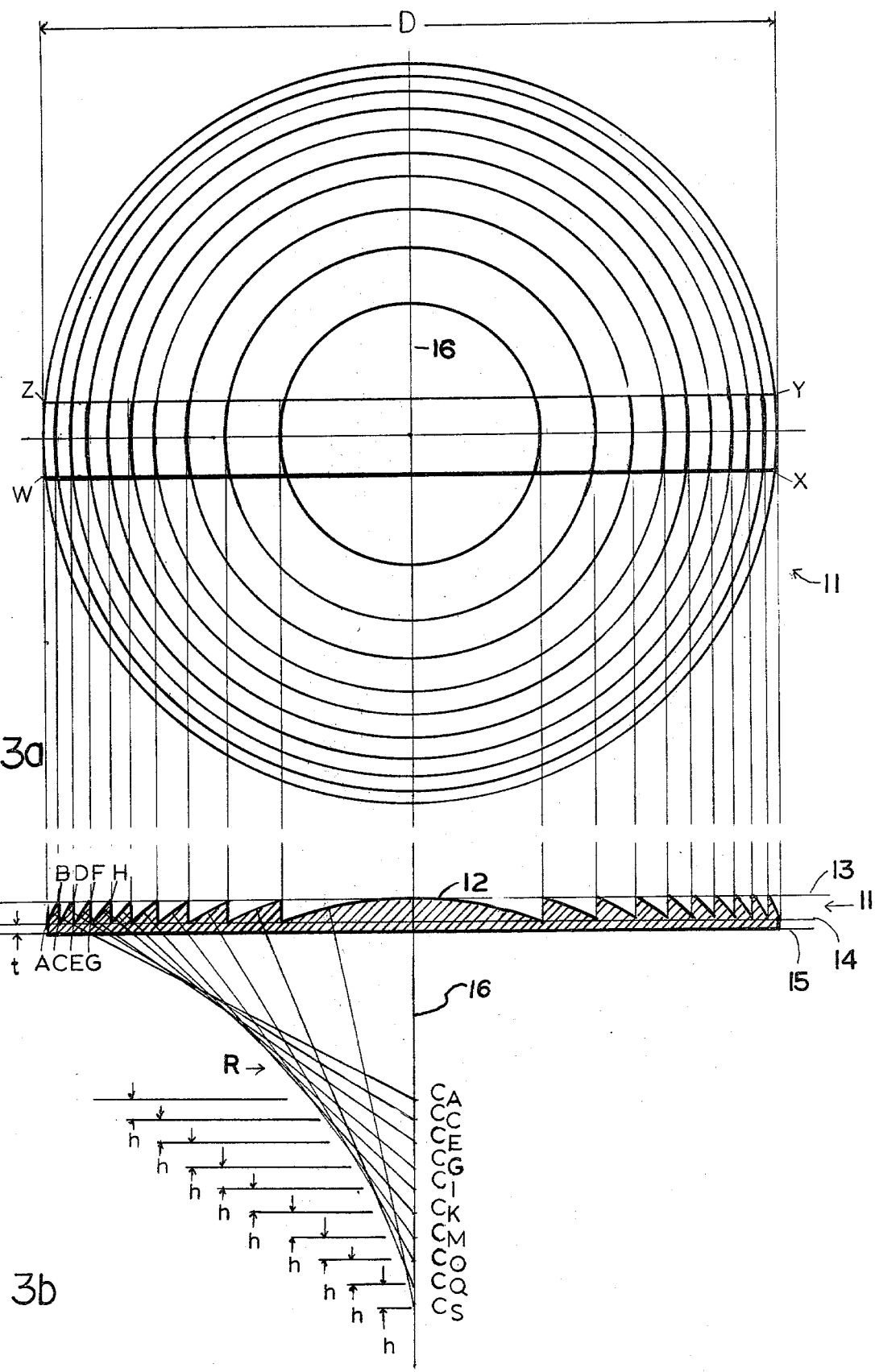
FIGS. 3a, 3b are plan view and side view, respectively of a refractive type focusing element means, showing the derivation of a central strip WXYZ of a Fresnel lens, actually used in conjunction with heat exchanger means.

Turning now to FIGS. 3a and 3b a Fresnel lens 11 having a cross section 12 may be defined in terms of the following parameters:

the diameter of the aperture of the lens D;
the radius R;
the height of the ridges h;
the minimum thickness t; and
the refractive index of the material of the lens u.

From the known lens equation, $$1/f = (u-1)(1/R_1 + 1/R_2) \qquad (3)$$

where f is the focal length of the lens and $R_1$ and $R_2$ are the radii of the two convex surfaces of the lens.

Assuming $R_1 = R$ and $R_2$ infinite, implying a plano-convex lens so that ridges will have to be formed only on one side of the lens, and assuming a refractive index about 1.5, the equation (2) may be written as, $$f = 2R \tag{3a}$$

By setting $$R = KD/2 \tag{4}$$

equation (3a) becomes $$f = KD \text{ or } f/D = K \tag{5}$$

indicating that K, the ratio of the radius R to half the apertures (D/2), is equal to the focal length to aperture ratio. Since the smallest value that R can take is D/2 at which value the lens becomes a hemisphere, K=1 the shortest focal length possible according to the equation (3a) is F=D, a focal length equal to the aperture. As values of K greater than unity would be preferable the resulting focal length is expected to be slightly greater than the aperture of the lens. In FIG. 3b a value of K=1.1 has been chosen, thereby R=0.55D and f=1.1D. For example, if aperture D of the lens were to be 5 ft. the focal length would be 5.5 ft.

Once the parameters of the lens have been determined the curved surfaces AB, CD, Ef, etc as shown in FIG. 3b are drawn between lines 13 and 14, which determine the height of the ridges, as arcs with centers $C_A$, $C_C$, $C_E$, etc. respectively, where the distance between any two consecutive centers is h. Preferably the value h is chosen to be an integral number of the medium wavelength of the solar spectrum. The lines joining the ends of the above arcs such as BC, DE, FG, etc are lines 13, 14 and 15 parallel to the surface of the lens and normal to the optical axis 16 of lens 11. This geometrical construction may be used to guide the method of construction of the original die, which can then be used for mass production of the lenses, by stamping, casting or injection.

In accordance with this method the sheet of metal used to make the die can be rotated about optical axis 16, shown in FIG. 3a and 3b while the cutting tool is effectively being pivoted from the centers such as $C_A$, $C_C$, $C_E$ etc. It may be noted that the cutting tool will cut, in an identical manner, if it is guided by an arc of radius greater than R, having centers at $C_A$, $C_C$, $C_E$ etc, but the tool and arc being conveniently located on the ridged side of the lens 11, while the actual distance of the cutting tool from the arc centers is being maintained at the value of R.

Referring now to FIG. 3a the lens 11 comprises circular ridges with radii corresponding to the distances from the optical axis 16 of the points A, C, E, etc. The distance of the nth such circular ridge from the optical axis 16 can be expressed as $$R_n = \sqrt{R^2 - \left(nh \cdot \sqrt{R^2 - D^2/4}\right)^2} \tag{6}$$

It should be noted that equation (3) while it provides an approximate solution to the lens performance it is not absolutely accurate. Spherical aberration, comma, and astigmatism are names describing lens errors which are not apparent from the equation(3). With today's availability of computers the shape of the lens surface can be computed to provide optimum performance.

According to the principles of optics focusing is accomplished by each element of the focusing means. This implies that the shape and size of the image of an object formed, for example, by a lens, especially at normal incidence, remains the same, regardless of what portion of the lens is actually being used. What changes when smaller portions of the lens are used is the intensity of the image. In the case of solar energy focusing, the object is the sun, effectively located at infinity, so that its image is being formed at the focus of the lens.

To accomplish the aim of relatively high temperature high concentration of sunlight is needed, which can be achieved by a relatively large lens aperture D. In order that the foci of adjacent lenses are spaced at sufficiently short intervals on the heat exchanger tube so that the impinging heat can easily spread by conduction over the entire body of the heat exchanger tube, only narrow strips such as the strip W X Y Z of the lens 11 shown in FIG. 3a are to be used as a focusing element means. As mentioned above this will not affect the shape of the image, which in the case of the sun as the object, will be a small circle.

Figure 4:
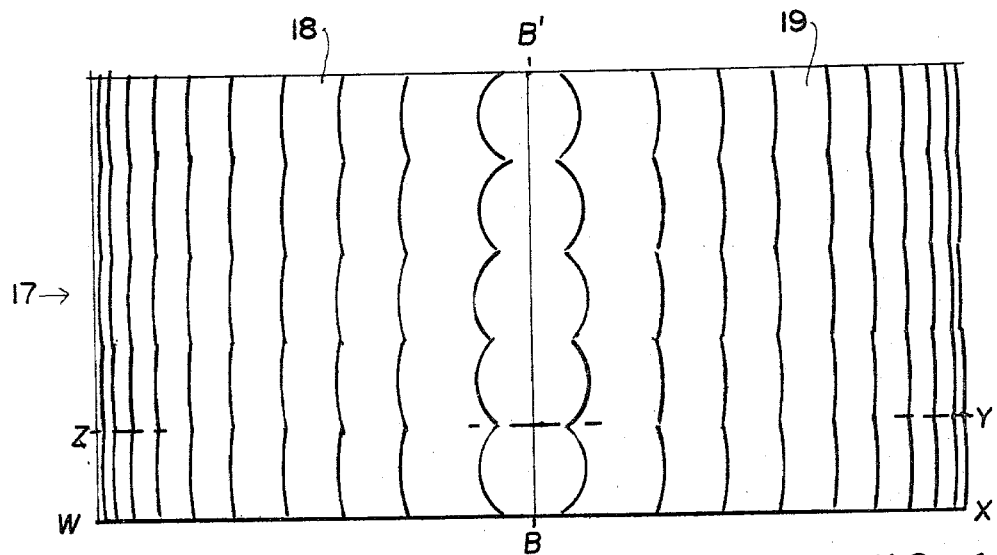
FIG. 4 is a plan view of an array of five of the central lens strips shown derived in FIGS. 3a, 3b placed side by side to form two symmetric lens panels.

FIG. 4 shows a W X Y Z rectangular section of a lens, identical to the W X Y Z element shown derived in FIG. 3a, now repeated 5 times to form a rectangular panel array 17 of W X Y Z lens elements. The axis BB' divides the array 17 into two identical square panels 18 and 19, symmetrically disposed with respect to the axis BB'. It is easier for the array 17 to be manufactured and be handled in terms of two square panels 18, 19 rather than a single rectangular panel 17.

FIG. 5 shows the array of focusing elements of FIG. 4, as two array panels 77, 78, concentrating the sun light, which is normally impinging on to the lens surfaces, on to five discrete foci formed on to the tubular heat exchanger 36.

FIG. 6 shows focusing array 17 as array panels 79, 80 with ray 39 after being refracted by the W X Y Z focusing element, as ray 41 being reflected by a mirror 54 to the new focus point 52, located symmetrically to the original focus 51 with respect to the mirror 54.

The benefits of the arrangement involving mirrors, as shown in FIG. 6 are: (1) the actual position of the heat exchanger 36 can be closer to the focusing means 17 and (2) mirrors 54 may contain screw adjustment (not shown) for a fine adjustment and therefore centering the light beam in an apertures such as aperture 53.

Referring now to FIG. 7a, the heat exchanger 36 is a metallic type, preferably made out of a high heat conductivity material such as copper, containing a working fluid 25, such as water, air, hydrogen, or helium. When a gaseous working fluid is used it may be highly pressurized so that it can carry a greater amount of energy. The preferred working fluid is here assumed to be air at a midrange pressure such as would be a pressure between 100 and 250 pounds per square inch. In case of a small leak the desired pressure can be easily maintained through a standby pump (not shown).

The heat exchanger 36 is preferably coated on its outer surface by a high absorbtivity low emissivity coating. Such coatings with an absorptivity as high as 95 and an emissivity of only 0.05 in the center of the solar spectrum have been reported to be available.

The heat exchanger 36 is being supported inside insulator tube 33, through supporting washers 24 made out of insulative material such as ceramics. The primary function of the insulator tube 33 is to provide an insulating space 22 between it and the heat exchanger tube 36. As a vacuum the insulating space 22 will provide maximum insulation. While various materials, including glass, could be used to make up the insulator tube 33, highest strength and reliability will be provided if the tube 33 is made of metal. The air-tight connection at the ends of each straight run, needed for sealing the space between the tubes 36, 33, is preferably made of metal which can easily be welded or brazed to each of said tubes. Since tube 33 is also made of metal it provide proper mechanical support and protection for the heat exchanger tube 36.

The tube 33 is provided with internal reflective surface 35, for reflecting back towards the heat exchanger tube 36 the radiation emitted by the hot heat exchanger tube 36. The insulator tube 33, therefore, provides dual insulation; conductive insulation by establishing the vacuum space 22 and radiative insulation through its reflective surface 35.

Apertures 34 spaced substantially equally along the length of the insulator tube 33 provide passage of the focused sun ray 38 to reach the heat exchanger tube 36, at a focus region 42.

A transparent aperture cover 21 preferably made out of glass is used to provide a solid surface across the apertures 34. The edge of the glass may be sealed directly against the body of the tube 33 through special sealants. Since such sealants usually need high temperature treatment, it may be easier for the glass to be fabricated and sealed as a unit with a holder 41 as a separate process. The holder 41 with the glass can then be attached to the tube 33 with the combination of a screw thread and an anearobic sealant, for maintaining of a vacuum within space 22.

It may be noted that while a substantial amount of radiation is incident on a small area of the focus region 42 the high conductivity of the body of the heat exchanger 36 is used to quickly conduct the incident heat away for the entire body of the heat exchanger thereby maintaining a uniform temperature. Heat will travel from the point of incidence of focus region 42 towards its opposite side along the length of the tube 36.

A cross section of the wall of the tube 36, other then a uniform wall, may exist, which will optimally distribute the heat in the body of the heat exchanger tube 36. It is the basis of a substantially uniform temperature over the body of the heat exchanger 36, that will help lower radiative losses from the heat exchanger 36 through the aperture cover glass 21 to the outer space, being that the greater portion of such radiation, falling on to the reflective inner surface 35 will be returned to the heat exchanger 36.

FIG. 7b shows a second embodiment of the invention wherein the concentrated solar light illuminates a solar cell 43, whereby a significant percentage of the solar energy is directly converted into electricity. Part of the light will be reflected by the surface of the solar cell and part of the reflected light will escape back towards space through the aperture 34. A substantial amount of such radiation will remain inside the tube 33 by being re-reflected from the surface 35, of the tube 33, to the solar cell 43.

Solar cells are usually photovoltaic cells comprising a photosensitive surface 45, made out of N-type silicon, a P-type layer 46 which also provides the positive connection plate 47 and a negative connection 48. When the cell 43 is illuminated the light quanta penetrate to exite the junction between the two layers 45 and 46 allowing electrons to flow from the negative connection 48 to the positive connection plate of heat sink 47.

An external circuit connected between the connection 48, 47 can utilize the electron current flow as electrical energy. A series parallel connection of a large number of cells can bring both the working voltage and current to operating levels.

Only a small portion of the light absorbed by the cell 43 is converted to electrical energy, the balance manifests itself as heat. Further, only a small portion of this heat will escape through the aperture 34 back into space. The balance will take two routes. In the first route heat will be conducted from the cell 43 to its heat sink such as the heat exchanger 36 while in the second route heat radiated from the cell 43 arrives and is substantially absorbed by the plate or heat sink 47 and heat exchanger 36 via one or more reflections from the reflective surface 35.

While normal solar cells will not withstand the high concentrations of light referred to by the invention recently developed cells, referred to as "concentrator cells" can process light concentrations up to 200. With normal solar cells rated up to a temperature of 257 degrees F. the concentrator cells which withstand higher temperatures can be used to provide temperatures in the working fluid which will be adequate for home heating and air-conditioning, hot water and even production of additional electricity using the pressure of the working fluid in the heat exchanger 36, to drive a turbine or an engine.

While the size of the aperture 34 is desired to be small so that only a small portion of the reflected and re-radiated energy will escape back to space, it may be desirable to spread the radiation through the aperture on to a larger surface such as the surface of the solar cell 43.

Spreading of the light beam can be easily accomplished if the transparent aperture cover 21 of aperture 34 is made in the form of a concave lens 44 as shown in FIG. 7b.

Figure 9:
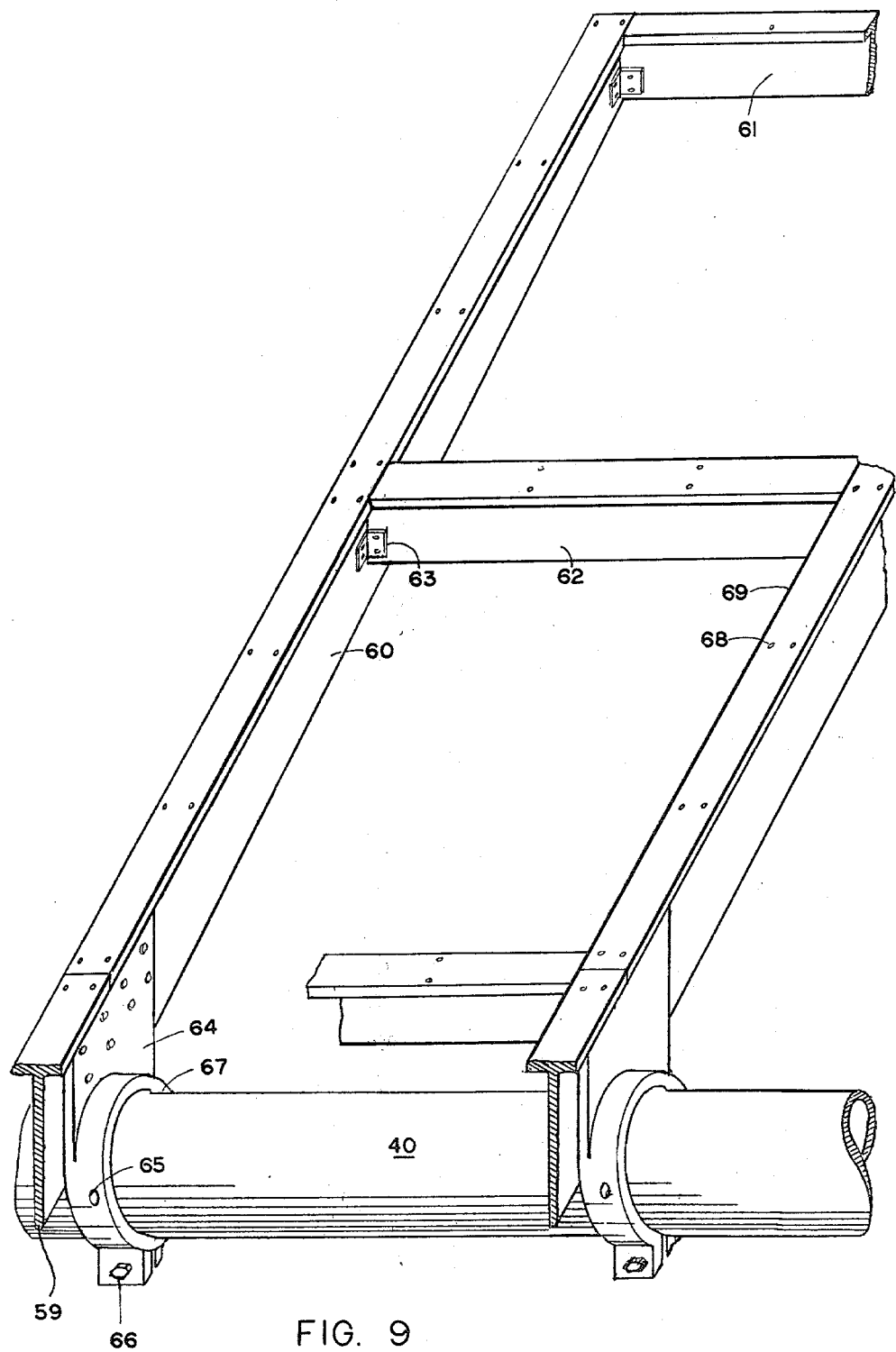
FIG. 9 is a side sectional perspective view showing details of the structural construction of the platform of FIG. 8.

Refering again to FIG. 8 and to FIG. 9 platform 20 supports a multiplicity of the light focusing means 10, in the form of square panels such as 18 and 19. The platform 20 is constructed around the shaft or spine member 40 which is also used as a support spine for the main portion for sun tracking system. The spine member and structure is shown in greater detail in FIG. 9. Cantilever members 59, 60 extend from the spine member 40 on each side. Each pair of the cantilever members 59, 60 can be fabricated from a single "I" shape extruded aluminum seperable in two so that each half will be tapered toward the end. After separation the two "T" shaped beams 59, 60 are joined through a splice 64. A circumferential adaptor section 67 attach the pair of cantilever beams 59, 60 onto the spine shaft 40. Securing means such as a through bolt 65 and tightening bolt 66 may be used for securing the adaptor section 67 to the spine shaft 40.

Aluminum spot welding may also provide further strength to the connection between the adaptor section 67 and the spine 40. The splice member 64 and the adaptor section 67 may be preferably cast as one piece out of a suitable metal. Webs 69 formed by the top of the "T" beams provide rigidity of the cantilever members 59, 60 along the plane of the platform 20. In addition webs 69 provide a convenient means for securing the panels 18, 19 on to the platform 20 by screws 70 shown in FIG. 8 through holes 68 provide on the web 69 as shown in FIG. 9. Accurate positioning and further rigidity of the cantilever members 59, 60 in the plane of the platform 20, is provided by brace members 62 interposed between and secure with the cantilever members by means of brackets 63.

While one type of focusing, either direct focusing such as shown in FIG. 5 or focusing through mirrors 50 such as shown in FIG. 6, may be used throughout the platform, FIG. 8 shows both types of focusing used with the same platform. Thus, the array panels 77 and 78 are directly focusing light into an array of foci formed along the heat energy receiving means 75. The heat energy receiving means 75 is supported by the cantilever members 60 of the platform 20, through supporting members 71.

Panels 79 and 80 gather focused light by combining their focusing through mirrors 50 at the new focal point 52. The energy receiving means 76 comprises heat exchanger 31 and heat exchanger tube 36 inside the insulator 33. Apertures such as apertures 53 of insulator 33 are facing towards the mirrors 59 and therefore cannot be seen in FIG. 8. The mirrors 50 previously described in FIG. 6 are supported by support members 72 in conjunction with a mirror supporting platform 58.

A connecting section 74 connect the energy receiving means 75, 76 to permit heat interaction therebetween. The section 74 comprises an inner tube such as 36 and an insulator tube such as 33 but no apertures. Energy receiving means 76, 75, and 81, 82 shown in FIG. 8 may be connected in series or in parallel depending on sizes and temperatures involved in a particular system.

Various methods may be employed for having the platform 20 supported and tracking the sun. While it may be easier to have the platform 20 supported and positioned, so that its surface remains substantially normal to the rays of the sun, be means attached to the roof of the building, it will be preferable if the platform 20 is supported by a tower based on solid ground. Such independent means of supporting and positioning the platform 20 will preclude the danger of damage to the house structure by the platform.

FIG. 1 shows such a preferred arrangement where a platform 20 is supported over the southern part of the house roof of a house 1. The platform 20 carrying optical panels 18, 19, is being supported by a tower 2, having a foundation 3.

Figure 10:
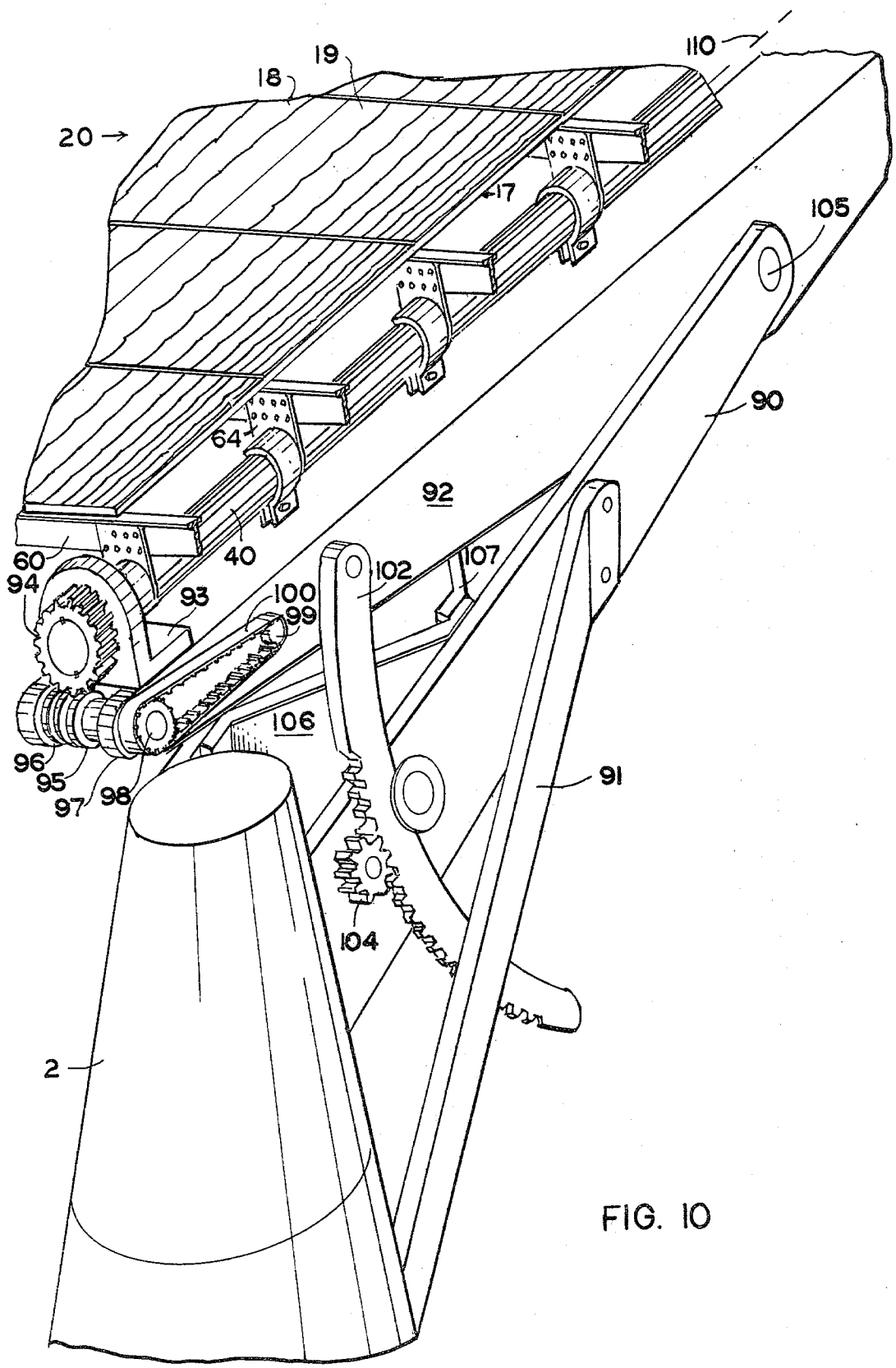
FIG. 10 is a side perspective view with portions shown broken away for clarity, and to display sun tracking means for East/West movement of the sun and its seasonal southern inclination.

A greater detail about the preferred method of support and positioning of the platform 20 is shown in FIG. 10.

Referring now to FIG. 10, the tower 2 provides an inclined truss 90, which provides a pivot 105 about which the platform 20 can be tilted to point toward the sun as its seasonal southern declination varies. The truss 90 is internally reinforced by cross members 106, 107. The truss 90 is structurally re-inforced by a support member 91, rigidly connected to the tower 2. The spine shaft 40 is rotatably supported by a yoke formed by a "U" beam 92 and two angle brackets 93. A gear 94 is rigidly attached to the shaft 40 so that, in conjunction with a worm gear 95, the shaft 40 and therefore the entire platform 20 can be rotated to track the sun during its daily movement. The worm gear 95 is rotatably supported by extenions 96, 97 of the U beam 92. Rotation of the worm gear 95 is provided by a drive motor, (not shown), providing rotation to a drive spracket 99, which is connected through a chain or belt 100 to a second spracket 98 coaxially and rigidly attached to same shaft as the worm gear 95.

Sun tracking due to the southern seasonal declination of the sun is accomplished by drive motor, not shown, driving through a gear train, a gear 104 which adjusts the angle of the "U" beam 92 about pivot 105, through a toothed arced member 102.

Automatic tracking is achieved by the rise of an error voltage when the normal to the platform is displaced from the line to the sun. Two pairs of photosensitive elements such as phototransistors are employed to detect North/South and East/West deviations. Thus phototransistors 5 and 8 positioned next to an aperture northward and southward, respectively, can provide a North/South error in terms of a voltage developed as a difference of currents provided by the phototransistors. When the platform it tilted too much to the South the transistor 8 will provide more current than transistor 5 causing the motor driving the gear 104 to rotate in the direction that will tilt the platform 20 Northwardly thus eliminating the error. A second pair comprising phototransistors 6 and 7 operate in a similar way for East/West positioning of the platform. Box 9 in the vicinity of the phototransistors 5, 6, 7, 8 serves to house the proper power supply and the electronic circuitry which is commercially available. An omnidirectional light detector, not shown, can provide signal to the electronic circuitry in box 9 when the sun rises in the morning or the sun reappears during a cloudy day. Such signal can provide sweep signals to the control circuitry so that the direction of the platform towards the sun can be re-initiated.

Referring now to FIG. 11, a second method is shown for supporting and guiding the platform 20, to track the sun. A truss 121, supported on to the roof of the house 1, provides a swivel ball joint for rotatably supporting the shaft 40 at the upper side. At the lower side the shaft 40 is permitted to be displaced between two members 125 and 126 forming an arc about a center located at the swivel ball joint 122. The members 125 and 126 restrict the shaft 40 from side movement but permit it to rotate about its axis. They also provide an effective slot in which the shaft 40 can be displaced vertically along the arc. This can be accomplished in terms of a cable 56 which is wound or unwound around a winch 129 by the action of a drive motor 57. Structural members 127, 123 and 124 provide support for the weight thrust which the platform exerts mainly towards the ground support members. East/West rotation of the platform is accomplished substantially similarly as previously described in terms of a worm drive 95 and worm gear 94 shown in FIG. 10. Guidance signals are provided as previously described in terms of the phototransistors 5, 6, 7, 8, and the electronic circuitry in box 9.

While specific embodiments of the invention have been shown and described in detail to illustrate the application of the principles of the invention, it will be understood that the invention may be embodied otherwise without departing from such principles.

What is claimed is:
1. A solar energy collector comprising:
 a hollow insulator member having an interior well defining a free space and having a plurality of apertures therethrough of a total surface area substantially less than that of a remainder of the insulator member;

a heat conductive member disposed in the free space, spaced inwardly of said interior wall and adapted to receive a heat transferring medium; and solar energy focusing means associated with said insulator member for focusing solar energy into the space through said apertures and onto said heat conductive member at impinging point to heat said heat conductive member whereby a heating of said heat conductive member is conducted away from the impinging points and to the heat transferring medium;

said heat conductive member being made of material which conducts heat easily; and said insulator member interior well having a radiation reflecting surface whereby most of the energy radiated from said heat conductive member after it is heated is reflected back toward said heat conductive member wherein said hollow insulating member comprises a first cylindrical tube having said plurality of apertures disposed along a line extending parallel to a major axis of said first cylindrical tube, said heat conductive member comprising a second cylindrical tube having a diameter less than that of said first cylindrical tube and being metallic with an annular space defined between an outer wall of said second cylindrical tube and an inner wall of said first cylindrical tube, each of said apertures covered, in a gas-tight manner with a window plate, said annular space having a partial vacuum established therein and said exterior wall of said second cylindrical tube having a heat-absorbent surface.

2. A solar energy collector according to claim 1 further including a light transparent window disposed across each of said apertures.

3. A solar energy collector according to claim 2 wherein a partial vacuum is established in the space.

4. A solar energy collector according to claim 1 wherein said solar energy focusing means comprise an array of substantially rectangular focusing lensing.

5. A solar energy collector according to claim 1 wherein said solar energy focusing means includes a substantially rectangular focusing panel for focusing the solar energy onto the impinging points, said focusing panel connected to said insulator member and spaced therefrom, said means for scanning the sun connected to said focusing panel and connected insulator member for moving said focusing panel and connected insulator member.

6. A solar energy collector according to claim 1 wherein said solar energy focusing means comprise a plurality of substantially rectangular Fresnel lenses.

7. A solar energy collector according to claim 1 wherein said solar energy focusing means comprises a planar panel of light refracting elements extending in a plane which is parallel to and spaced from a tangent plane to an exterior surface of said first cylindrical tube containing said plurality of apertures.

* * * * *